US005818944A

United States Patent [19]

[11] Patent Number: 5,818,944

Takamiya et al.

[45] Date of Patent: Oct. 6, 1998

[54] REVERBERATION GENERATING SYSTEM FOR GENERATING LATER PART OF REVERBERATION FROM INITIAL PART OF REVERBERATION AND METHOD OF GENERATING THE REVERBERATION

[75] Inventors: Tsugumasa Takamiya; Tomomitsu Urai; Shinji Kishinaga, all of Shizuoka, Japan

[73] Assignee: Yamaha Corporation, Hamamatsu, Japan

[21] Appl. No.: 823,959

[22] Filed: Mar. 25, 1997

[30] Foreign Application Priority Data

Mar. 25, 1996 [JP] Japan .................................... 8-096125

[51] Int. Cl.[6] .................................................. H03G 3/00

[52] U.S. Cl. ............................................. 381/63; 84/630

[58] Field of Search .............................. 84/630, DIG. 26; 381/61, 62, 63, 64

[56] References Cited

U.S. PATENT DOCUMENTS

| | | | |
|---|---|---|---|
| 5,040,220 | 8/1991 | Iwamatsu | 381/63 |
| 5,619,579 | 4/1997 | Ando et al. | 381/63 |

*Primary Examiner*—Vivian Chang
*Attorney, Agent, or Firm*—Pillsbury Madison & Sutro LLP

[57] ABSTRACT

A reverberation generating system stores parameter data representative of a series of timings and a series of sound intensities for an initial part of reverberation, and calculates a series of parameter data for the later part of reverberation by using a return map of the proportional constant for time intervals of the initial part inversely proportional to the square of lapse of time so that the reverberation generating system stores the parameter data for the initial part only.

12 Claims, 10 Drawing Sheets

REVERBERATION GENERATING SYSTEM FOR GENERATING LATER PART OF REVERBERATION FROM INITIAL PART OF REVERBERATION AND METHOD OF GENERATING THE REVERBERATION

FIELD OF THE INVENTION

This invention relates to a reverberation controlling technique used for an auditorium and, more particularly, to a reverberation generating system for artificially synthesizing virtual sound field and a method of controlling reverberation.

DESCRIPTION OF THE RELATED ART

A reverberator artificially synthesizes a virtual sound field, and gives music with concert-hall presence. The prior art reverberator synthesizes the virtual sound field through the following processes.

First, a prior art reverberation synthesizing technique imparts initial reflected sounds to an acoustic sound, only. FIG. 1 illustrates the first prior art reverberator. The prior art reverberator comprises a parameter memory 1*a* and a digital signal processor 1*b*. The parameter memory 1*a* stores parameters representative of impulse response for initial reflected sounds, and supplies suitable parameters to the digital signal processor 1*b*. The digital signal processor 1*b* is responsive to a digital audio signal S1 representative of an acoustic sound so as to read out suitable parameters from the parameter memory 1*a*. The digital signal processor 1*b* carries out a convolution between the input represented by the digital audio signal S1 and the impulse response, and the convolution results in a digital reverberation signal S2 representative of the initial reflected sounds.

The first prior art reverberation synthesizing technique merely gives the initial reflected sounds to the acoustic sound, and, accordingly, the reverberation time is short. In order to prolong the reverberation time, the digital signal processor requires a large amount of parameters. The parameter memory 1*a* is expected to store various kinds of reflected sounds. This results in a large amount of memory capacity provided by, for example, a hard disk unit. The hard disk unit is so expensive that the user contents the short reverberation.

The second reverberation synthesizing technique uses an IIR (Infinite-duration Impulse Response) digital filter. FIG. 2 illustrates the second prior art reverberator. The digital audio signal S1 is supplied to a feedback loop incorporated in the IIR digital filter 2, and IIR digital filter 2 produces a digital reverberation signal S3 representative of reflected sounds. However, the IIR digital filter merely produces a simple reverberation pattern. Therefore, the second reverberation synthesizing technique hardly gives a virtual sound field like a concert hall.

The third reverberation synthesizing technique is a compromise between the first reverberation synthesizing technique and the second reverberation synthesizing technique. FIG. 3 illustrates the circuit configuration of the third reverberator, and the third prior art reverberator is broken down into an initial reflected sound generator 3*a*, a reverberation generator 3*b* and a mixer 3*c*.

The initial reflected sound generator 3*a* is similar to the first prior art reverberator, and includes the parameter memory la and the digital signal processor 1*b*. The initial reflected sound generator 3*a* produces the reverberation signal S2 from the digital audio signal S1 through the convolution. The digital signal processor 1*b* supplies the reverberation signal S2 to the mixer 3*c*.

On the other hand, the reverberation generator 3*b* includes a delay circuit 3*d* and the IIR digital filter 2. The delay circuit 3*d* introduces time delay approximately equal to the reverberation time of the series of initial reflected sounds into the signal propagation of the digital audio signal S1, and supplies the delayed digital audio signal S1' to the IIR digital filter 2. The IIR digital filter 2 produces the reverberation signal S3 from the delayed digital audio signal S1', and supplies the reverberation signal S3 to the mixer 3*c*.

The mixer 3*c* causes the reverberation signal S3 to follow the reverberation signal S2, and produces a composite reverberation signal S4.

Thus, the third prior art reverberator prolongs the reverberation without increase the parameters stored in the parameter memory 1*a*. However, the later part of the reverberation is unnaturally connected to the initial part of the reverberation. As described hereinbefore, the reverberation obtained through the IIR digital filter 2 is simple and unnatural in time density. When an audience hears the reverberation produced from the composite reverberation signal S4, the audience feels the change between the initial part and the later part unnatural.

The fourth prior art reverberator is another compromise between the first reverberation synthesizing technique and the second reverberation synthesizing technique. FIG. 4 illustrates the circuit configuration of the fourth reverberator. The fourth prior art reverberator is also broken down into an initial reflected sound generator 4*a*, a reverberation generator 4*b* and a mixer 4*c*.

The initial reflected sound generator 4*a* includes the parameter memory 1*a* and the digital signal processor 1*b*, and the reverberation generator 4*b* is implemented the IIR digital filter 2. The digital signal processor 1*b* is connected in parallel to the input port of the IIR digital filter 2 and the mixer 4*c*, and the output port of the IIR digital filter 2 is connected to the mixer 4*c*. Thus, the reverberation generator 4*b* is connected in series to the initial reflected sound generator 4*a*, and produces the reverberation signal S3' representative of the later part of the reverberation from the reverberation signal S1 representative of the initial reflected sound. The mixer 4*c* outputs a composite reverberation signal S5.

The transition from the initial part to the later part is slightly improved by the generation of the reverberation from the initial reflected sounds. However, an audience still feels the reverberation produced from the composite reverberation signal S5 unnatural.

SUMMARY OF THE INVENTION

It is therefore an important object of the present invention to provide a reverberator which generates a natural reverberation for long time.

It is also an important object of the present invention to provide a method of generating a natural reverberation for long time through a simple sequence.

In accordance with one aspect of the present invention, there is provided a reverberation generating system comprising: a data storing means for storing first parameter data of first timings and first sound intensities for initial reflected sounds to be serially produced after an original sound; a return map storing means for storing a return map for a set of first proportional constants generated through an interpolation from a point group of a map for a set of second proportional constants, one of the second proportional constants being equal to the product between the square of a first lapse of time from a reference point to the first timing of associated one of the initial reflected sounds and a first time interval between the first timing of the associated one of the initial reflected sounds and the first timing of the next initial reflected sound; a first parameter date generating means for generating second parameter data of second timings for later reflected sounds to be serially produced after the initial reflected sounds, a second time interval between the first timing of the last initial reflected sound and the second timing of the first later reflected sound or between the second timing of one of the later reflected sounds and the second timing of the next later reflected sound being equal to the quotient obtained by dividing one of the first proportional constants associated with a reference time interval by the square of a second lapse of time from the reference point to the last initial reflected sound or the aforesaid one of the later reflected sounds; a second parameter data generating means for generating third parameter data of second sound intensities for the later reflected sounds to be produced at the second timings, respectively; and a data processing means responsive to the first parameter data, the second parameter data and the third parameter data for carrying out a convolution on the basis of an acoustic data of the original sound, thereby serially generating the initial reflected sounds and the later reflected sounds.

In accordance with another aspect of the present invention, there is provided a method of generating later reflected sounds from initial reflected sounds, comprising the steps of: a) determining a set of first proportional constants from first timings of initial reflected sounds to be serially produced after an original sound, one of the first proportional constants being equal to the product between the square of a first lapse of time from a reference point to the first timing of associated one of the initial reflected sounds and a time interval between the first timing of the associated one of the initial reflected sounds and the first timing of the next initial reflected sound; b) forming a return map for second proportional constants obtained through an interpolation carried out on the set of first proportional constants; c) determining second timings of later reflected sounds to be serially produced after the initial reflected sounds by using the return map, a second time interval between the first timing of the last initial reflected sound and the second timing of the first later reflected sound or between the second timing of one of the later reflected sounds and the second timing of the next later reflected sound being equal to the quotient obtained by dividing one of the second proportional constants associated with a reference time interval by the square of a second lapse of time from the reference point to the last initial reflected sound or the aforesaid one of the later reflected sounds; and d) determining sound intensities of the later reflected sounds from intensities of the initial reflected sounds for the later reflected sounds to be produced at the second timings, respectively.

BRIEF DESCRIPTION OF THE DRAWINGS

The features and advantages of the reverberator and the method according to the present invention will be more clearly understood from the following description taken in conjunction with the accompanying drawings in which.

DESCRIPTION OF THE PREFERRED EMBODIMENT

Term “initial reflected sound” and term “later part of reverberation” are defined as follows. Generally, the initial reflected sound and the later part of reverberation are classified by using an absolute lapse of time from a generation of original sound. However, these technical terms are differently used in the following description. The present inventor uses term “initial reflected sound” and term “later part of reverberation” as relative concepts. The initial reflected sounds are directly measured or calculated through a known method. On the other hand, if a series of reflected sounds are determined on the basis of such initial reflected sounds through a method to which the present invention appertains, these reflected sounds belong to the later part of reverberation. Therefore, a difference takes place. A reflected sound may form a part of the later part of reverberation in view of the lapse of time. However, if the delay parameter of the reflected sound is, by way of example, calculated on the basis of the mirror reflection theory, the present inventor refers the reflected sound as initial reflected sound.

Figure 1:
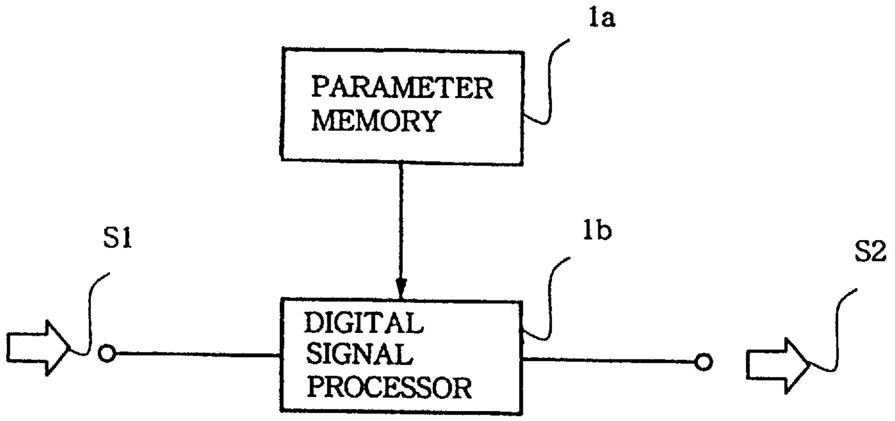
Fig. 1 PRIOR ART
FIG. 1 is a block diagram showing the circuit configuration of the first prior art reverberator.
Figure 2:
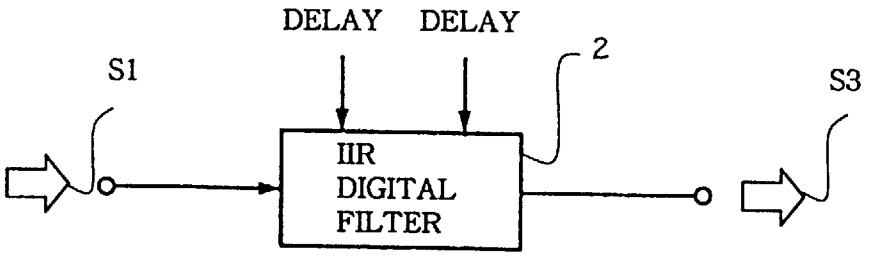
Fig. 2 PRIOR ART
FIG. 2 is a block diagram showing the circuit configuration of the second prior art reverberator.
Figure 3:
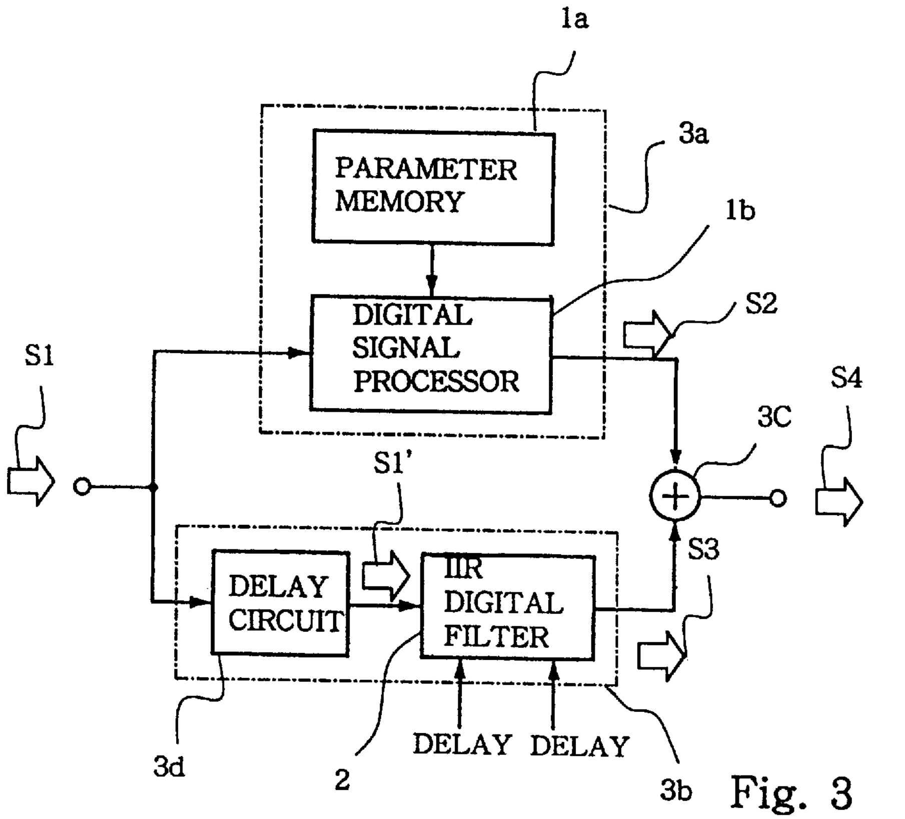
Fig. 3 PRIOR ART
FIG. 3 is a block diagram showing the circuit configuration of the third prior art reverberator.
Figure 4:
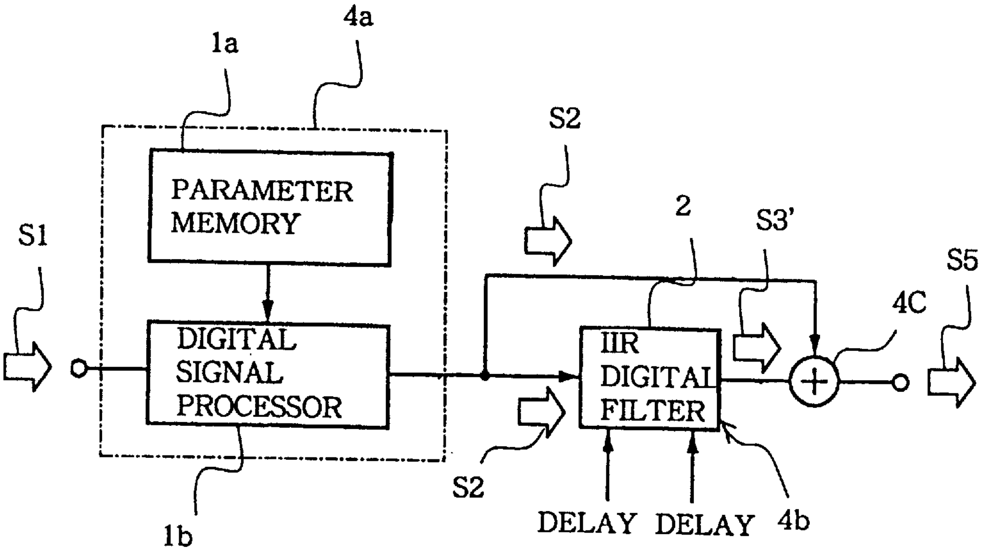
Fig. 4 PRIOR ART
FIG. 4 is a block diagram showing the circuit configuration of the fourth prior art reverberation.
Figure 5:
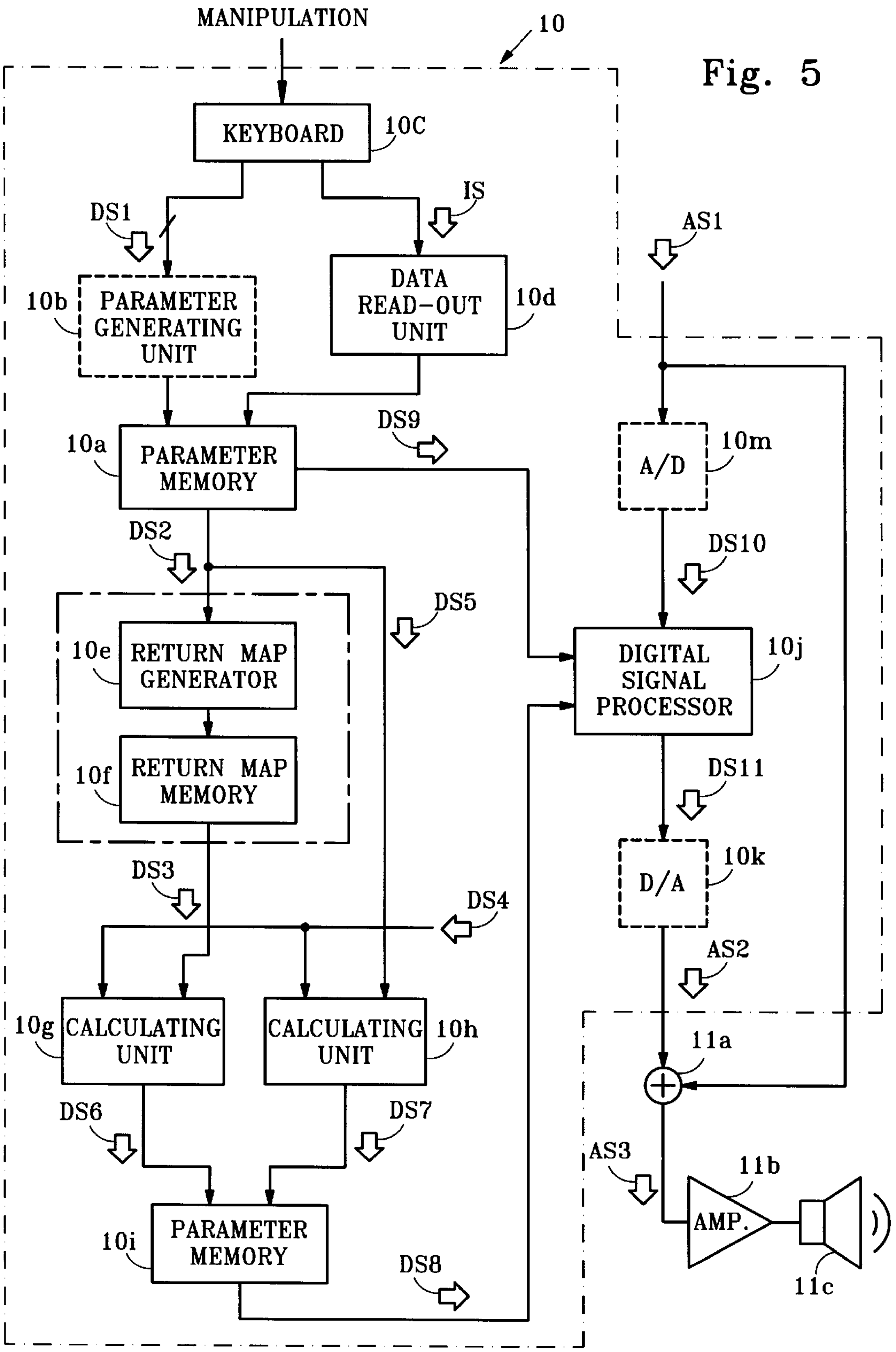
FIG. 5 is a block diagram showing the arrangement of a reverberation generating system according to the present invention.

FIG. 5 illustrates a reverberation generating system 10 embodying the present invention. The reverberation generating system 10 comprises a parameter memory 10*a*, a parameter generating unit 10*b*, a keyboard 10*c* and a data read-out unit 10*d*.

The parameter memory 10*a* stores a plurality of groups of parameter data for initial reflected sounds, and are respectively represent reverberations in different sound fields. Each group of parameter data is used for generation of a series of initial reflected sounds on the assumption that a sound source is placed in a particular sound field. A group of parameter data represent a series of timings sequentially delayed from a generation of sound at a sound source and a series of sound intensities.

The groups of parameter data are actually measured in concert halls or other typical sound fields. However, when an operator manipulates keys on the keyboard 10*c* for specifying a sound field, the parameter generating unit 10*b* calculates a group of parameter data on the basis of the mirror reflecting theory or a geometric acoustic calculating method, and the new group of parameter data is stored in the parameter memory 10*a*. The sound field may be specified by a digital data signal DS1 representative of dimensional data for a hall, positional data for a sound source and positional data for a sound receiver.

One of the sound fields is selected by an operator through the keyboard 10*c*, and the keyboard 10*c* transfers an instruction signal IS representative of the selection to the data read-out unit 10*d*. A group of parameter data is read out from the parameter memory 10*a*, and is representative of a series of initial reflected sounds in the selected sound field.

The reverberation generating system further comprises a return map generator 10*e* and a return map memory 10*f*. The return map generator 10*e* generates a return map from a digital data signal DS2 representative of a series of timings of the selected group of parameter data, and the return map is stored in the return map memory 10*f*.

As described hereinbefore, a group of parameter data indicates a series of timings sequentially delayed from a generation of sound, and a series of initial reflected sounds are assumed to be generated at the respective timings. The return map generator 10*e* firstly determines a point group of map for a proportional constant. The point group contains a fluctuation, and defines a series of time intervals between two initial reflected sounds. The time interval is inversely proportional to the square of the lapse of time from the generation of the sound to associated one of the initial reflected sounds. Thereafter, the return map generator 10*e* interpolates the point group, and generates the return map.

The reverberation generating system 10 further comprises two data processing units 10*g*/10*h*. One of the data processing units 10*g* calculates parameter data representative of timings for a series of reflected sounds in the later part of reverberation on the basis of the return map. A time interval between a reflected sound and the previous reflected sound is inversely proportional to the square of lapse of time between the generation of the original sound and the reflected sound, and the proportional constant is supplied from the return map stored in the return map memory 10*f* as a digital data signal DS3. The later part of reverberation continue for a time period automatically given upon selection of the group of parameter data. However, an operator may specify a total time period T for the reverberation. In this case, the time period for the later part of reverberation is determined on the basis of the reverberation time T and the lapse of time occupied by the initial reflected sounds. The reverberation time T is represented by a digital data signal DS4, and the digital data signal DS4 is supplied to both data processing units 10*g* and 10*h*.

The other data processing unit 10*h* is responsive to a digital data signal DS5 representative of the series of sound intensities of the selected group read out from the parameter memory 10*a* for calculating the sound intensity of a series of reflected sounds of the later part of the reverberation. The reverberation time period T is also given through the selection or the digital data signal DS4. The data processing unit 10*h* determines the sound intensity of each reflected sound of the later part of reverberation. The sound intensity is gradually decayed as an exponential function obtained through the least square method.

The reverberation generating system 10 further comprises a parameter memory 10*i* for temporarily storing parameter data representative of the series of timings and the series of sound intensities. The data processing unit 10*g* transfers the series of timings to the parameter memory 10*i* as a digital data signal DS6, and the other data processing unit 10*h* transfers the series of sound intensities to the parameter memory 10*i* as a digital data signal DS7. The sound intensities are respectively related to the timings, and are stored in the parameter memory 10*i* in a rewritable manner. Even if a series of timings and a series of sound intensities have been already stored in the parameter memory 10*i*, the new timings and new sound intensities are written into the parameter memory 10*i*. However, if a series of initial reflected sounds are twice selected, the timings and the sound intensities calculated for the first initial reflected sounds are available for the second initial reflected sounds without a calculation carried out by the data processing units 10*g*/10*h*. The parameter data are sequentially read out from the parameter memory 10*i* as a digital parameter signal DS8. The parameter data are also sequentially read out from the parameter memory 10*a* as a digital parameter signal DS9, and the digital parameter signal DS8 follows the digital parameter signal DS9.

The reverberation generating system 10 further comprises a digital signal processor 10*j* connected at input ports to the parameter memories 10*a*/10*i* and a source of sound signal (not shown) and a digital-to-analog converter 10*k* connected to the output port of the digital signal processor 10*j*. If a piece of sound information is supplied from the source of sound signal as an analog sound signal AS1, an analog-to-digital converter 10*m* is connected between the source of sound signal and the digital signal processor 10*j*, and the analog sound signal AS1 is converted to the digital sound signal DS10. The digital signal processor 10*j* executes a convolution between the digital sound signal DS10 and the digital parameter signals DS8/DS9, and produces a digital reverberation signal DS11 representative of a series of initial reflected sounds and the later part of reverberation. The digital reverberation signal DS11 is supplied to the digital-to-analog converter 10*k*, and the digital-to-analog converter 10*k* converts the digital reverberation signal DS11 to an analog reverberation signal AS2. The digital-to-analog converter 10*k* may be omitted from the reverberation generating system 10 so as to supply the digital reverberation signal DS11 to a sound system.

The analog reverberation signal AS2 is supplied to a mixer 11*a*, and the analog reverberation signal AS2 is mixed with the analog sound signal AS1. The mixer 11*a* supplies an analog sound signal AS3 through an amplifier unit 11*b* to a speaker system 11*c*, and the original sound is reproduced together with the reverberation.

Subsequently, the method of producing the parameter data for the later part of reverberation is hereinbelow detailed. Assuming now that a sound source radiates a sound, a series of reverberation sounds reach a certain position spaced from the sound source at intervals in an inverse proportion to the square of time period from the generation of the sound to the reverberation sounds. However, the time intervals contain a fluctuation. The fluctuation is not regular, nor random. The fluctuation is, so to speak, "Khaos" in Greek. However, the fluctuation makes a person feel the reverberation natural. The fluctuation in a reverberation sound seems to affect the fluctuation of a reverberation sound produced thereafter.

Figure 6:
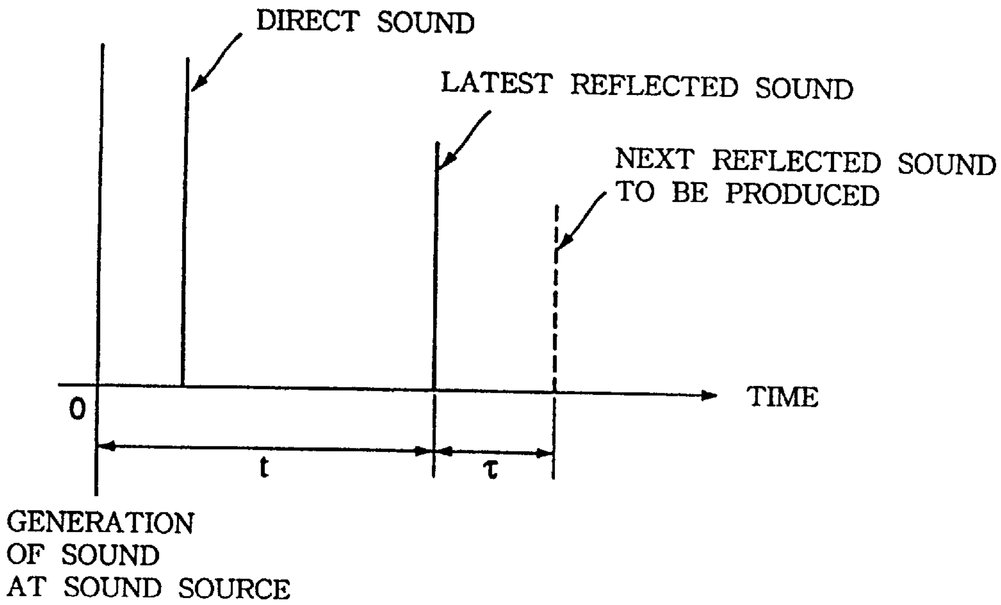
FIG. 6 is a graph showing a direct sound and reflected sounds on a time scale.

As shown in FIG. 6, while reflected sounds are being repeated, a time interval between two reflected sounds is defines as $$tau=k/t^2 \qquad \text{Equation 1}$$

where t is the lapse of time between the generation of a sound and the latest reflected sound and k is a proportional constant containing the fluctuation.

The reverberation generating system 10 firstly calculates the proportional constant k for each initial reflected sound, and determines a set of the proportional constant {k}. Subsequently, the set {k} is mapped to itself, and produces a return map. The reverberation generating system 10 sequentially calculates a series of proportional constant k for reflected sounds of the later part of reverberation, and determines the timings for the reflected sounds of the later part of the reverberation.

The sound intensity or a square of sound pressure $p^2$ is represented by an exponential function at each of the timings for the reflected sounds of the later part of the reverberation.

$$p^2=a\times exp\ (-b\times t) \qquad \text{Equation 2}$$

where a and b are coefficients. The coefficients a and b are calculated from the sound intensities of initial reflected sounds and the time period for the reverberation through the least square method. Each of the timings calculated by the data processing unit 10*g* is paired with the square of sound pressure $p^2$ associated therewith.

Figure 7:
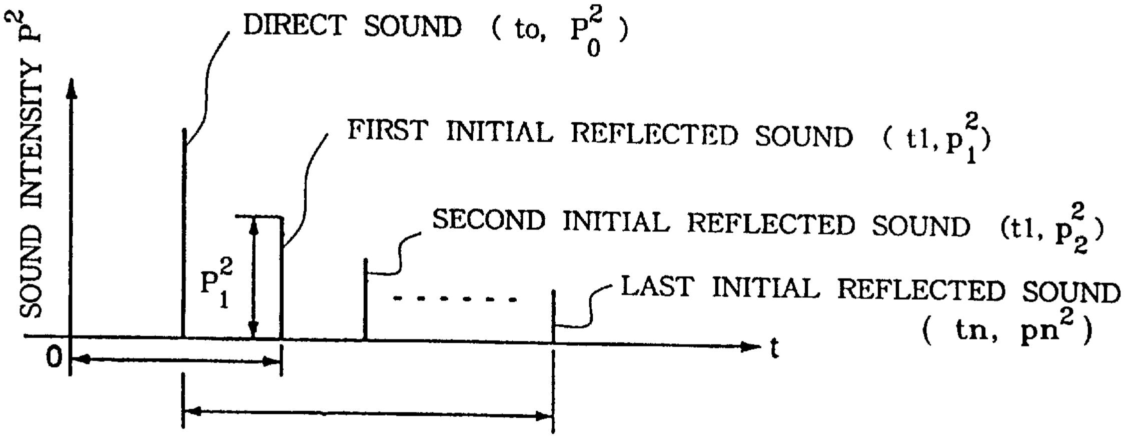
FIG. 7 is a graph showing a series of initial reflected sounds represented by parameter data.

The parameter data for the initial reflected sounds are represented as (ti, $P^2$i) where i=1, 2, . . . , n as shown in FIG. 7, and the initial reflected sounds are assumed to occupy 5 to 10 percent of the reverberation time T. Then, the parameter data for the later part of reverberation are represented as (ti, $P^2$i) where i=n+1, n+2, . . . , and are stored in the parameter memory 10*i*.

Figure 8A:
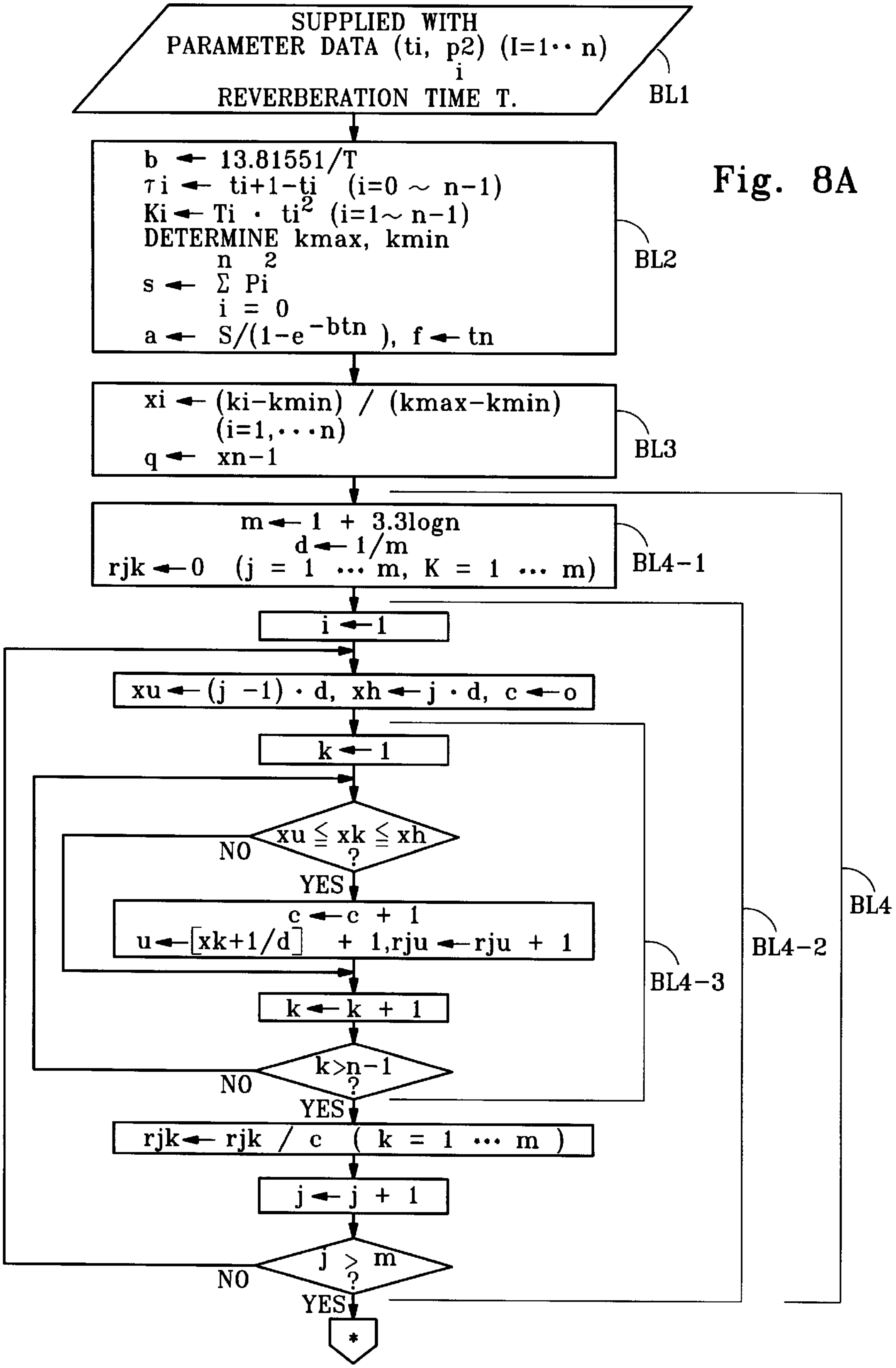
FIGS. 8A and 8B are flow charts showing a program sequence executed by the reverberation generating system.
Figure 8B:
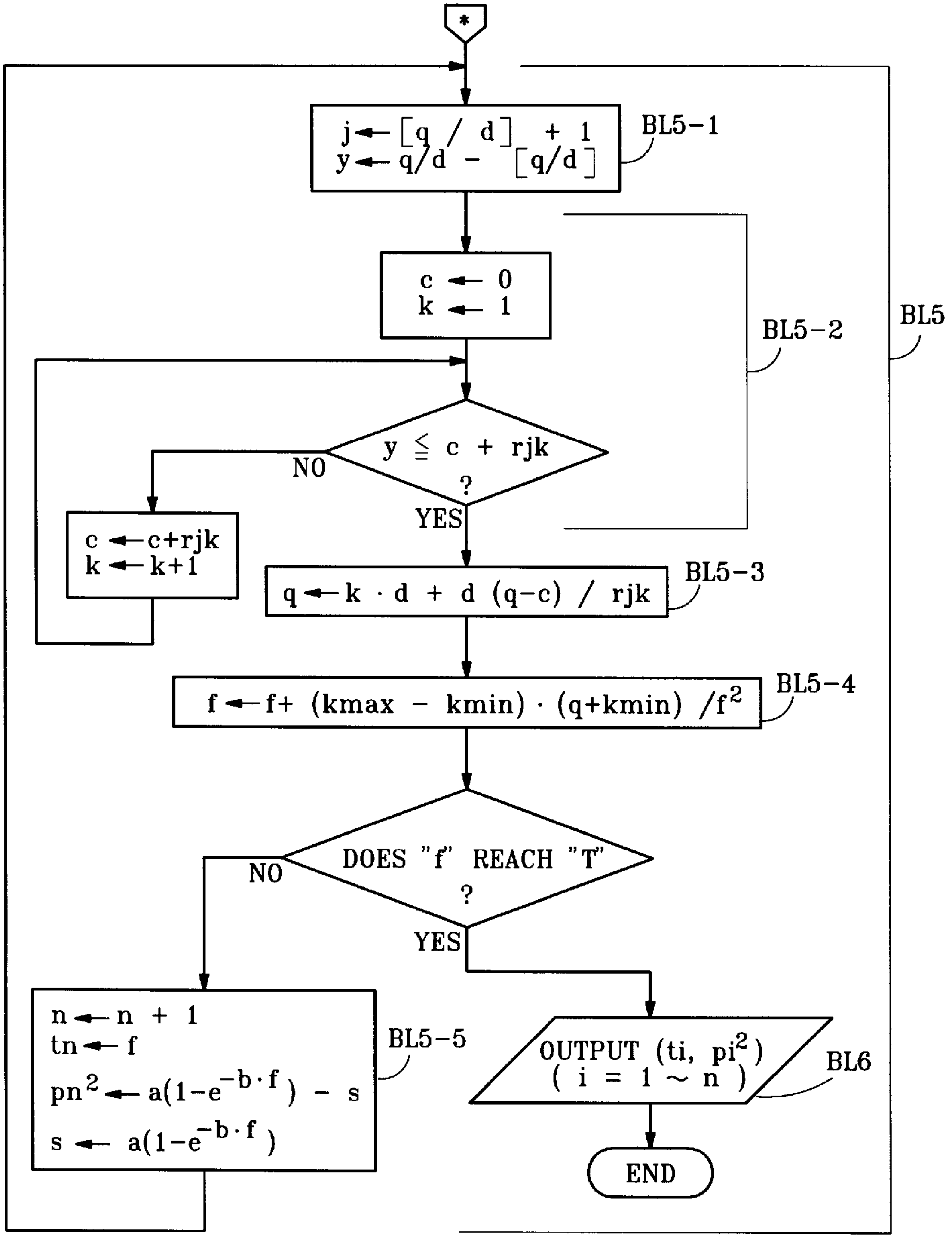

FIGS. 8A and 8B illustrate a program sequence executed by the reverberation generating system 10. First, the parameter data (ti, $P^2$i) for the initial reflected sounds and the reverberation time T are supplied to the data processing units as by block BL1.

Figure 9:
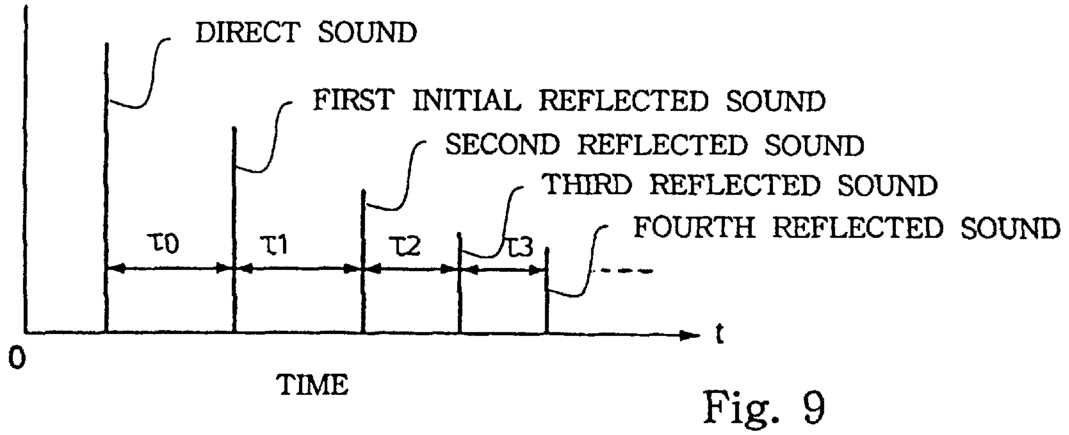
FIG. 9 is a graph showing the initial reflected sounds on a time scale.

The reverberation generating system 10 calculates the coefficients b, a and s, the time intervals tau-i, the proportional constants ki, the maximum proportional constant kmax, the minimum proportional constant kmin and the time f when the last initial reflected sound tn takes place as by block BL2. Tau-i is the time intervals between the initial reflected sounds as shown in FIG. 9, and t-aui, where i=1, 2, . . . , n, is represented as follows.

tau-1=k1/t$1^2$, tau-2=k2/t$2^2$, tau-n=kn/$tn^2$ where ki (i=1, 2, . . . n) is the proportional constant. The proportional constant ki is varied with the fluctuation, and the maximum proportional constant kmax and the minimum proportional constant kmin are selected from the set {k}. The timing tn for the last initial reflected sound is necessary for the first reflected sound of the later part of reverberation, and, for this reason, the timing tn is stored as a time data f. The coefficients b, s and a are used in the calculation for the square of sound pressure $P^2$.

Subsequently, the reverberation generating system 10 proceeds to block BL3. The proportional constants ki ranges between the maximum proportional constant kmax and the minimum proportional constant kmin, and the reverberation generating system 10 changes the proportional constants ki to value xi between zero and one through a linear transformation. The last value $x_{n-1}$ is also necessary for the generation of the first reflected sound (tn+1, Pn+$1^2$), and is stored as a control data q. The control data q is corresponding to tau-$_{n-1}$. Although the linear transformation makes the next calculation easy, it is not an indispensable step, and the calculation may be carried out with the proportional constant ki.

Figure 10:
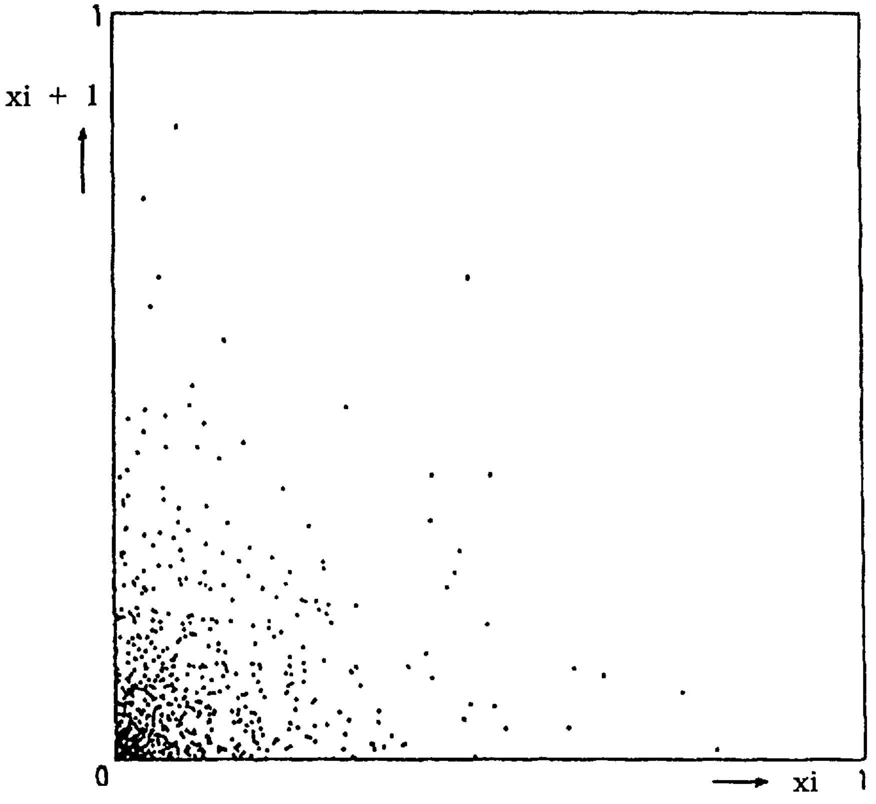
FIG. 10 is a graph showing a map of pairs of proportional constants for initial reflected sounds.

Subsequently, the reverberation generating system 10 proceeds to block BL4-1, and forms the return map. The point group of the map for the initial reflected sounds xi (i=1, 2, . . . , n−1) is treated with an interpolation so as to determine the first reflected sound xn from the last initial reflected sound $x_{n-1}$, the second reflected sound xn+1 from the first reflected sound xn, the third reflected sound xn+2 from the second reflected sound xn+1 and so fourth. The map of the proportional constant (xi, xi+1) or (ki, ki+1) is discrete as shown in FIG. 10, and is hardly used for the reflected sounds of the later part of reverberation. For this reason, the point group of the map is interpolated through a linear interpolation, a polynomial interpolation, a spline interpolation or an interpolation using a known function so as to form the return map.

Figure 11A:
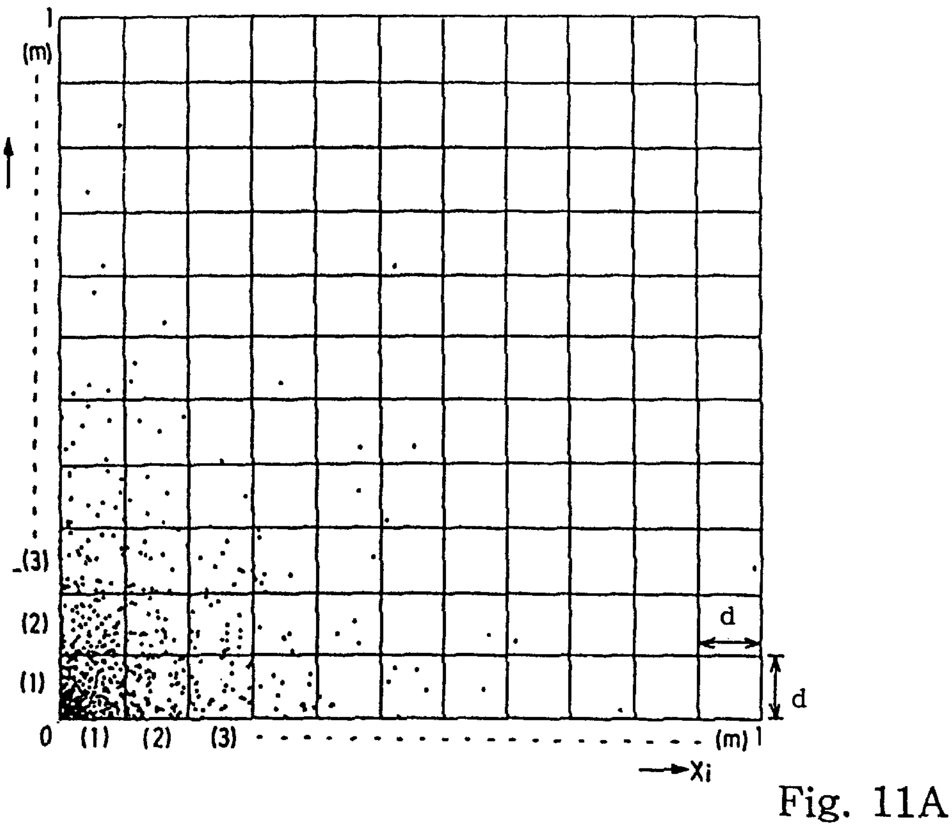
FIGS. 11A and 11B are views showing an interpolation using a square matrix.

Block BL4 shows a linear interpolation using a square matrix. The square matrix used in the linear interpolation has the dimension m×m, and the section [0,1] is divided by m as shown in FIG. 11A. Each element is expressed by d×d, and is set to zero. The value of m is not limited to FIG. 11A. Any value is available for m in so far as the value is appropriate to the number n of the initial reflected sounds.

Block BL4-2 is a loop for giving a value to each of the rows (1, 2, . . . , j, . . . , m) of the matrix r. "X" ranges from zero to 1, and is divided by "m", then jth section is assigned to [(j−1)d, jd] where d is 1/m. Block BL4-3 is a sub-loop for counting xk picked up from xi (i=1, 2, . . . , n−1) for each of the sections, and writes the discrete value in "c". Concurrently, the section which contains $x_{k+1}$ is determined, and value "1" is added to $r_{ju}$. When all of xi are examined, the sub-loop BL4-3 is completed. Subsequently, all the elements of jth row of the matrix r are divided by c, and the value is given to the row. In the sub-loop BL4-3, [xkn/d] represents the maximum integer which does not exceed xk+1/d. In short, a conditional frequency distribution is determined through the loop BL4-2 and BL4-3.

Figure 11B:
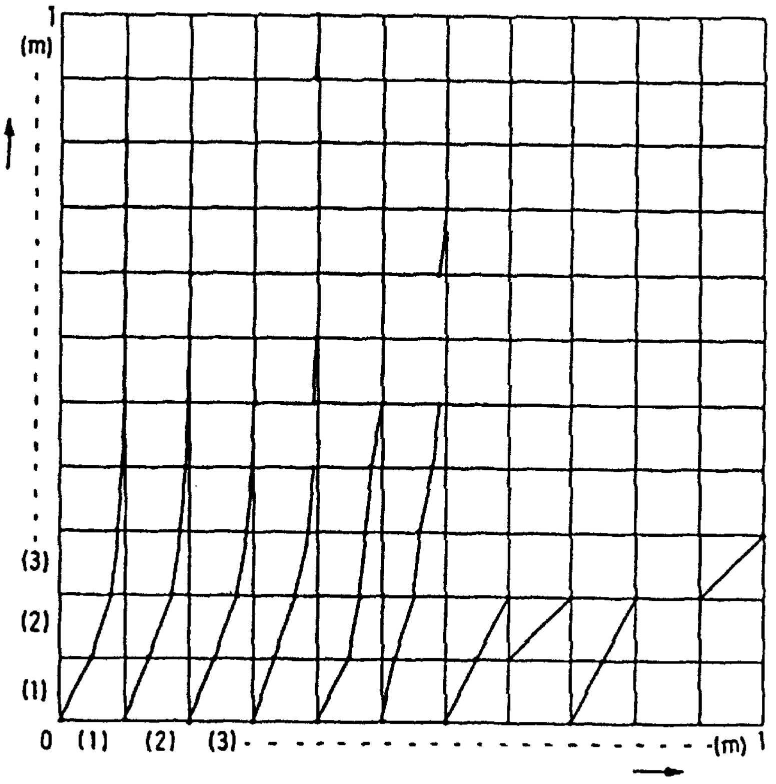

The total number of each section on the abscissa is assumed to represent 100 percent, and the discrete values are respectively plotted in the sections. The discrete values are linked with one another, and polygonal lines are obtained as shown in FIG. 11B. The polygonal lines are representative of the return map in which the point group of the map for the proportional constants of the initial reflected sounds is interpolated. The reflected sounds of the later part of reverberation xn, xn+1, xn+2 . . . are sequentially determined from the last initial reflected sound $x_{n-1}$ and the previous reflected sounds of the later part of reverberation xn, xn+1.

All the data necessary for the later part of reverberation are obtained as described hereinbefore. Subsequently, the reflected sounds of the later part of reverberation are successively determined, and BL5 is the loop for determining the reflected sounds of the later part of reverberation. When the time "f" for a reflected sound reaches the reverberation time T, the reverberation generating system 10 terminates the generation of reflected sound represented by the loop BL5.

Figure 12:
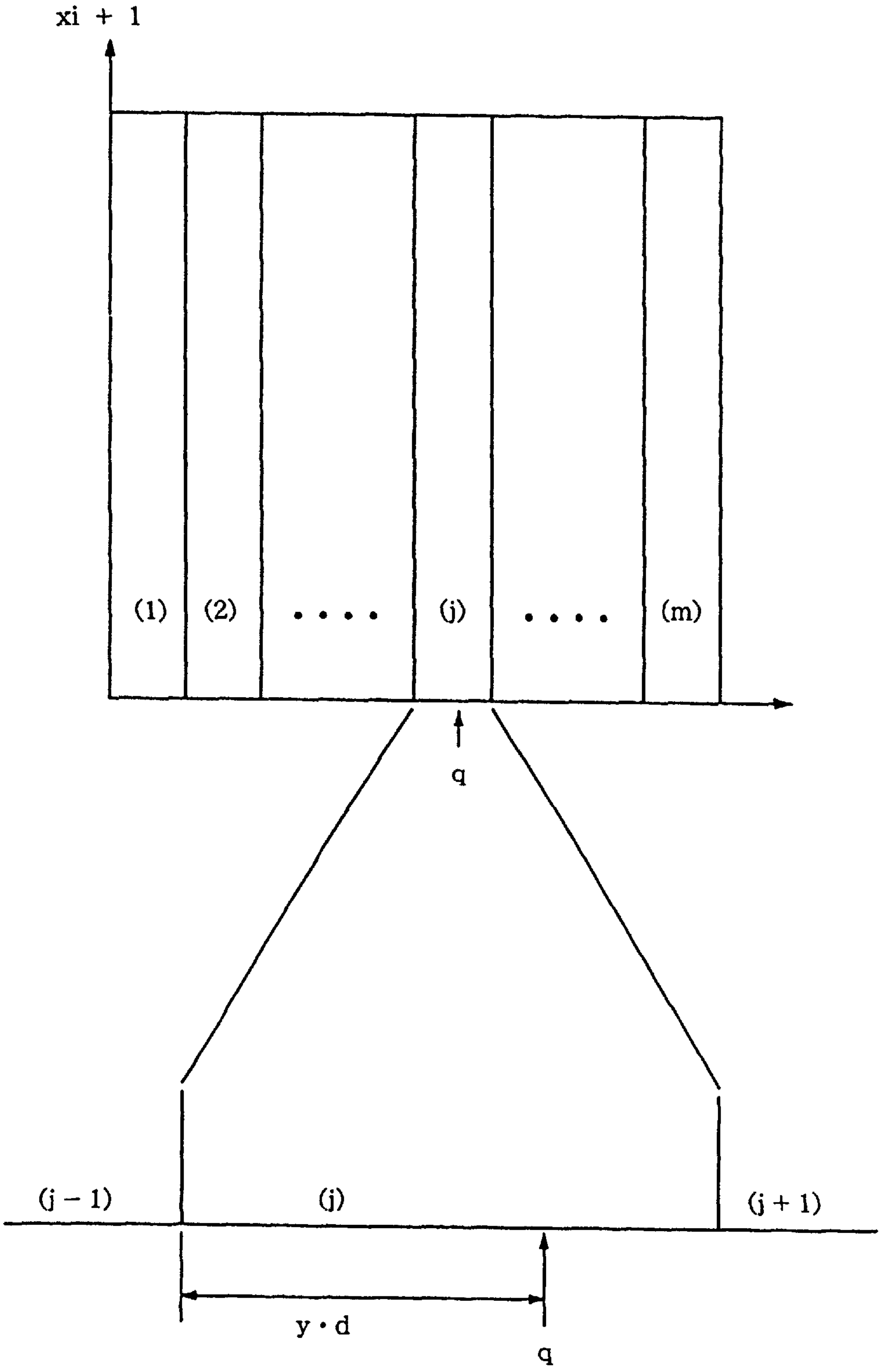
FIG. 12 is a view showing a step of determining a deviation of “q”

In block BL5-1, the reverberation generating system 10 determines section number "j" on the abscissa which contains "q" and a deviation y of "q" from the lower limit of the section as shown in FIG. 12. The deviation is represented as 0≦y≦1. In block BL5-2, the reverberation generating system 10 seeks a section k of jth row of the square matrix r where sum of k term of element $r_{jk}$ (k=1, . . . m) exceeds "y".

$$\sum_{k=1}^{n} r_{jk} = 1 \qquad \text{Equation 3}$$

0≦y≦1 Then, such "k" really exists between 1 and m. Thus, a range where the next "q" exists is determined from the value of present "q". It is the section [kÑd, (k+1)Ñd]. Then, the reverberation generating system 10 determines a new value for "q" in block BL5-3. Thus, "xn" is produced from "$x_{n-1}$."

Subsequently, the reverberation generating system 10 determines the time $t_{n+1}$ for the next reflected sound in the later part of reverberation as by block BL5-4. In the equation of block BL5-4, "q" and "f" are xn and $t_{n-1}$, respectively, and the reverberation generating system 10 carries out an inverse transformation of the linear transformation.

$$kn=(kmax-kmin)\tilde{N}(xn+kmin) \quad \text{Equation 4}$$

The proportional constant kn is determined through the inverse transformation. The time interval tau-n is determined from $t_{n-1}$.

$$tau\text{-}n=kn/t_{n-1}^2 \quad \text{Equation 5}$$

The time interval tau-n is added to $t_{n-1}$. Then, the time tn for the reflected sound is given as $$tn=t_{n-1}+tau\text{-}n \quad \text{Equation 6}$$

Thus, xn in FIG. 11B is mapped to $x_{n+1}$, and $x_{n+1}$ serves as xn in the next mapping operation.

The reverberation generating system 10 determines the intensity $Pn^2$ of the reflected sound at time tn as by block BL5-5.

The reverberation generating system 10 repeats the block BL5, and generates the parameter data (ti, $Pi^2$) for a series of reflected sounds of the later part of reverberation, and the parameter data (ti, $Pi^2$) is supplied to the digital signal processor 10*j* as by block BL6.

Figure 13A:
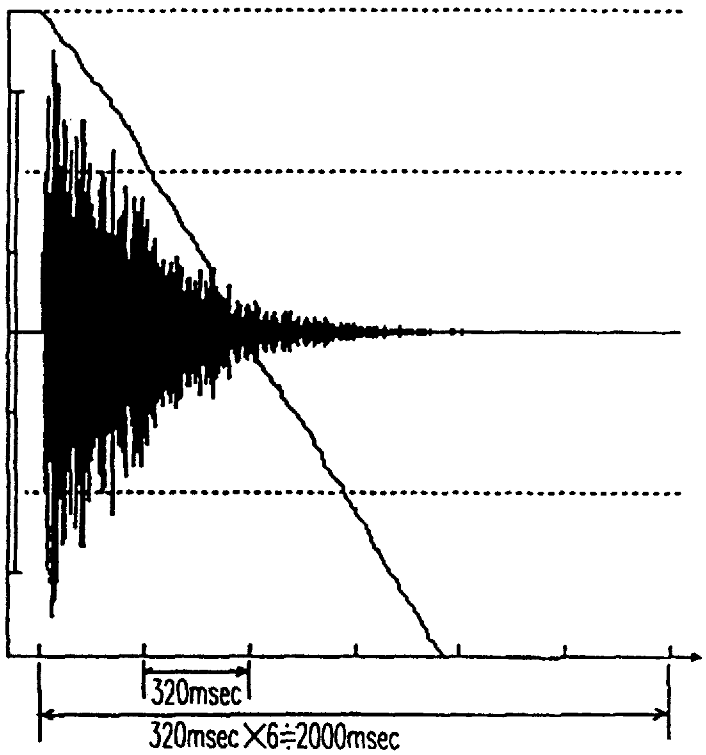
FIG. 13A is a graph showing the reverberation obtained through the mirror reflecting theory.
Figure 13B:
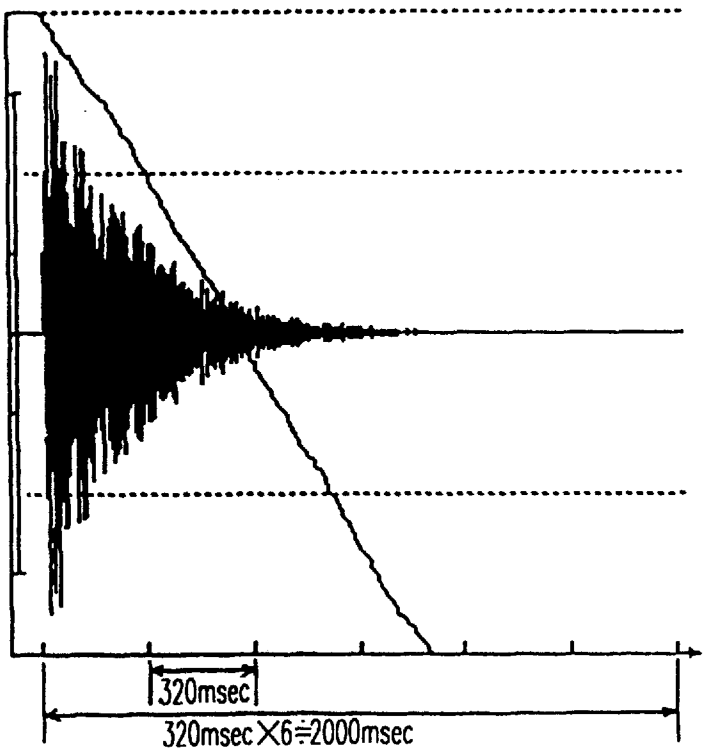
FIG. 13B is a graph showing the reverberation obtained through the method according to the present invention.

The present inventors evaluated the reverberation generated through the method according to the present invention. The present inventor produced all the reflected sounds of a reverberation through the mirror reflecting theory, and the reverberation was shown in FIG. 13A. The present inventor further produced a reverberation shown in FIG. 13B. The initial part of reverberation shown in FIG. 13B was produced until 200 millisecond through the mirror reflecting theory, and the later part of reverberation was produced through the method according to the present invention. Comparing the reverberation shown in FIG. 13B with the reverberation shown in FIG. 13A through a hearing test, the reverberations were hardly discriminated from each other, and the present inventors felt the reverberation produced through the method according to the present invention natural.

As will be understood from the foregoing description, a series of reflected sounds in the later part of reverberation are successively produced at time intervals containing fluctuation similar to that of the initial reflected sounds, and are naturally continued from the last initial reflected sound.

Moreover, the parameter data for the later part of reverberation are calculated on the basis of a selected one group of the parameter data for the initial reflected sounds, and only a small amount of memory capacity is required for the parameter memory 10*a*. This results in a simple arrangement of the reverberation generating system.

The parameter generating unit 10*b* is incorporated in the reverberation generating system, and allows an analyst to simulate a reverberation in a new kind of sound field.

Although a particular embodiment of the present invention has been shown and described, it will be obvious to those skilled in the art that various changes and modifications may be made without departing from the spirit and scope of the present invention.

For example, the parameter data for each reflected sound may be available for the reflected sound after the next reflected sound. Moreover, the lapse of time may run from the receipt of direct sound.

If the parameter memory stores some typical maps of the initial reflected sounds or return maps thereof in a non-volatile manner, one of the maps or one of the return maps is directly specified by the selection of the sound field, and the later part of reverberation is immediately produced from the original sound.

What is claimed is:

1. A reverberation generating system comprising:

a data storing means for storing first parameter data of first timings and first sound intensities for initial reflected sounds to be serially produced after an original sound;

a return map storing means for storing a return map for a set of first proportional constants generated through an interpolation from a point group of a map for a set of second proportional constants, one of said second proportional constants being equal to the product between the square of a first lapse of time from a reference point to the first timing of associated one of said initial reflected sounds and a first time interval between said first timing of said associated one of said initial reflected sounds and the first timing of the next initial reflected sound;

a first parameter data generating means for generating second parameter data of second timings for later reflected sounds to be serially produced after said initial reflected sounds, a second time interval between the first timing of the last initial reflected sound and the second timing of the first later reflected sound or between the second timing of one of said later reflected sounds and the second timing of the next later reflected sound being equal to the quotient obtained by dividing one of said first proportional constants associated with a reference time interval by the square of a second lapse of time from said reference point to said last initial reflected sound or said one of said later reflected sounds;

a second parameter data generating means for generating third parameter data of second sound intensities for said later reflected sounds to be produced at said second timings, respectively; and a data processing means responsive to said first parameter data, said second parameter data and said third parameter data for carrying out a convolution on the basis of an acoustic data of said original sound, thereby serially generating said initial reflected sounds and said later reflected sounds.

2. The reverberation generating system as set forth in claim 1, in which said reference point is a timing at which said original sound is generated.

3. The reverberation generating system as set forth in claim 1, in which said first parameter data are calculated by using a mirror reflecting theory.

4. The reverberation generating system as set forth in claim 1, in which said interpolation is a linear interpolation.

5. The reverberation generating system as set forth in claim 4, in which said linear interpolation uses a square matrix.

6. The reverberation generating system as set forth in claim 1, in which said reference time interval is one of the first time interval between said first timing of said last initial reflected sound and the first timing of another initial reflected sound immediately before said last initial reflected sound and the second time interval between said second timing of said one of said later reflected sounds and the second timing immediately before said one of said later reflected sounds.

7. A method of generating later reflected sounds from initial reflected sounds, comprising the steps of:

a) determining a set of first proportional constants from first timings of initial reflected sounds to be serially produced after an original sound, one of said first proportional constants being equal to the product between the square of a first lapse of time from a reference point to the first timing of associated one of said initial reflected sounds and a time interval between said first timing of said associated one of said initial reflected sounds and the first timing of the next initial reflected sound;

b) forming a return map for second proportional constants obtained through an interpolation carried out on said set of first proportional constants;

c) determining second timings of later reflected sounds to be serially produced after said initial reflected sounds by using said return map, a second time interval between the first timing of the last initial reflected sound and the second timing of the first later reflected sound or between the second timing of one of said later reflected sounds and the second timing of the next later reflected sound being equal to the quotient obtained by dividing one of said second proportional constants associated with a reference time interval by the square of a second lapse of time from said reference point to said last initial reflected sound or said one of said later reflected sounds; and d) determining sound intensities of said later reflected sounds from intensities of said initial reflected sounds for said later reflected sounds to be produced at said second timings, respectively.

8. The method as set forth in claim 7, in which said reference point is a timing at which said original sound is generated.

9. The method as set forth in claim 7, in which said first timings and said sound intensities of said initial reflected sounds are calculated by using a mirror reflecting theory.

10. The method as set forth in claim 7, in which said interpolation is a linear interpolation.

11. The method as set forth in claim 10, in which said linear interpolation uses a square matrix.

12. The method as set forth in claim 7, in which said reference time interval is one of the first time interval between said first timing of said last initial reflected sound and the first timing of another initial reflected sound immediately before said last initial reflected sound and the second time interval between said second timing of said one of said later reflected sounds and the second timing immediately before said one of said later reflected sounds.

* * * * *